United States Patent

Kadowaki et al.

[11] Patent Number: 5,917,630
[45] Date of Patent: *Jun. 29, 1999

[54] CONTROLLING APPARATUS FOR REMOTE CONTROL OPERATION

[75] Inventors: Kazuo Kadowaki; Jun Nosaka; Tadamitsu Isonaka; Kouichi Katsumi; Chiaki Nobuoka; Takanori Iida; Akio Kirimura; Mitsue Takamori, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/658,230

[22] Filed: Jun. 4, 1996

[30] Foreign Application Priority Data

Jun. 6, 1995 [JP] Japan .................. 7-139241

[51] Int. Cl.$^6$ ................................................ H04B 10/00
[52] U.S. Cl. ............................................ 359/142; 359/146
[58] Field of Search .................................. 359/142, 143, 359/144, 145, 147, 148, 172, 152, 146

[56] References Cited

U.S. PATENT DOCUMENTS

| | | | |
|---|---|---|---|
| 4,717,913 | 1/1988 | Elger | 359/143 |
| 4,809,360 | 2/1989 | Kraft | 359/142 |
| 5,291,325 | 3/1994 | Elliott | 359/142 |
| 5,359,448 | 10/1994 | Laszlo et al. | 359/142 |
| 5,530,576 | 6/1996 | Jackson et al. | 359/145 |
| 5,530,578 | 6/1996 | Takemoto et al. | 359/152 |
| 5,554,979 | 9/1996 | Kohar et al. | 359/142 |
| 5,596,648 | 1/1997 | Fast | 359/142 |

FOREIGN PATENT DOCUMENTS

| | | | |
|---|---|---|---|
| 0084329 | 4/1988 | Japan | 359/142 |
| 0068098 | 3/1989 | Japan | 359/142 |
| 0103397 | 4/1989 | Japan | 359/142 |
| 0187632 | 8/1991 | Japan | 359/142 |
| 456537 | 2/1992 | Japan . | |
| 4117800 | 4/1992 | Japan . | |
| 531484 | 4/1993 | Japan . | |
| 9116795 | 10/1991 | WIPO | 359/142 |

Primary Examiner—Rafael Bacares

[57] ABSTRACT

A remote control apparatus for use with an equipment which includes a master apparatus and a slave apparatus remotely located from the master apparatus. The master apparatus transmits a control signal to the slave apparatus so as to remotely control the slave apparatus. The master apparatus has a light-transmitting section therein which projects outwardly of the master apparatus. The light-transmitting section transmits a light signal representing a control signal generated in the master apparatus. The slave apparatus has a light-receiving section therein which receives the light signal. The light-transmitting section may be detachably mounted to the master apparatus. The light-transmitting section may be adapted to rotate relative to the master apparatus after the light-transmitting section has been mounted to the master apparatus. The light-transmitting section may include a plurality of light-emitting elements so that light is emitted over a wide area.

18 Claims, 10 Drawing Sheets

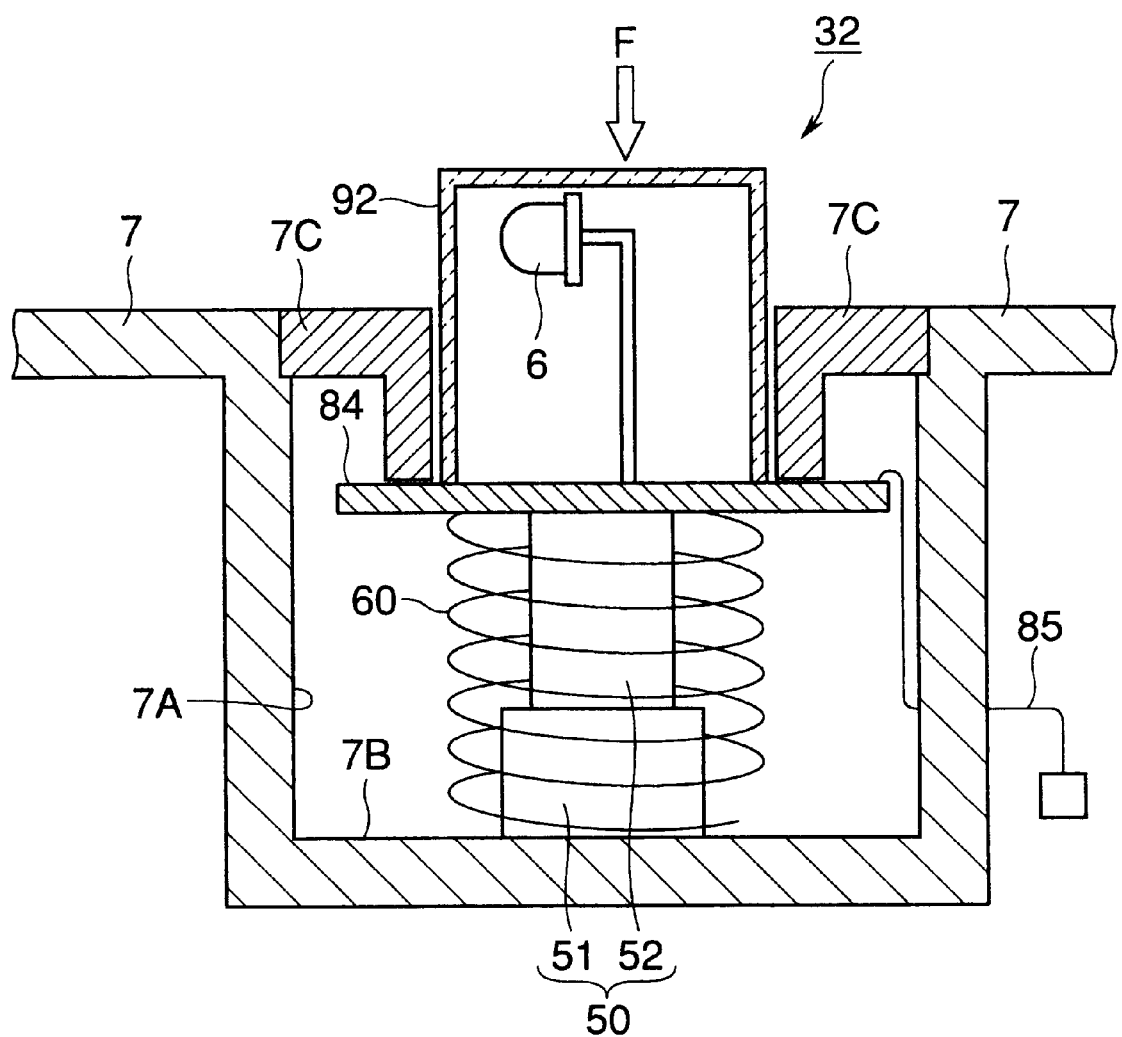

CONTROLLING APPARATUS FOR REMOTE CONTROL OPERATION

BACKGROUND OF THE INVENTION

The present invention relates to a controlling apparatus for remote control operation where a master apparatus installed at a fixed location transmits a control signal to a slave apparatus placed at a remote location.

A variety of remote control apparatuses using, for example, infrared rays have been proposed where a master apparatus controls a slave apparatus at a remote location. A variety of combinations of master and slave apparatuses are possible. In this specification, the invention will be described with respect to a magnetic recording/reproducing apparatus 1 as a master apparatus and a tuner 2 as a slave apparatus separate from the magnetic recording/reproducing apparatus 1.

FIG. 11 is a perspective view of a magnetic recording/reproducing apparatus 1 and a tuner 2 to which a prior art remote control apparatus is applied. Referring to FIG. 11, the magnetic recording/reproducing apparatus 1 incorporates a light-transmitting section 3. The light-emitting section 3 transmits a light signal 5 that represents a control signal, generated in the magnetic recording/reproducing apparatus 1, for controlling the separate tuner 2. The tuner 2 incorporates a light-receiving section 4 that receives the light signal 5 transmitted from the light-transmitting section 3, and converts the light signal 5 into an electric signal. The electric signal is directed to various sections in the tuner 2. As mentioned above, the remote control apparatus is constructed of the light-transmitting section 3 and light-receiving section 4, so that the control signal is communicated between them to remotely control the tuner 2.

FIG. 12 is a cross-sectional view of the light-transmitting section 3 in FIG. 11. The light-transmitting section 3 includes a light emitting diode (referred to as LED hereinafter) 6. The LED 6 is soldered to a printed circuit board 8 fixedly held in the magnetic recording/reproducing apparatus 1, and is controlled to turn on and off in accordance with a control signal outputted from a control signal generating circuit, not shown, so as to emit a light signal 5. A housing 7 is formed with an opening therein in alignment with the LED 6 and a light-transmissive plastics panel 9 is fitted into the opening to protect the LED 6 from environment. Thus, the light signal 5 emitted from the LED 6 exits the magnetic recording/reproducing apparatus 1 through the plastics panel 9.

Commonly used LEDs emit light that travels in an area within about 60–70 degrees of its optical axis, which is the direction of maximum radiation. Thus, the light signal 5 emitted from the LED 6 travels in the air while spreading in an area bounded by the aforementioned angles.

The prior art remote control apparatus is of the construction where the light emitted within the magnetic recording/reproducing apparatus 1 exits through the plastics panel 9. Therefore, part of the light signal 5 emitted from the LED 6 is blocked by the housing 7 as shown by a hatched area R in FIG. 12. The light travels only through an area defined by an angle X1 to the outside of the housing. Therefore, the tuner 2 cannot receive the light signal 5 if the tuner 2 is located outside of the space defined by the angle X1. Thus, remote control fails.

The light-transmitting section 3 is constructed of a single LED 6 fixed in the housing 7. Installing the magnetic recording/reproducing apparatus 1 at a fixed location automatically determines the area in which the tuner can receive the light signal 5. In other words, the location of the tuner 2 is confined to a particular area determined by the location of the magnetic recording/reproducing apparatus 1.

SUMMARY OF THE INVENTION

The present invention is to provide a remote control apparatus in which the light signal may be transmitted over a wide area.

The remote control apparatus is for use with equipment which includes a master apparatus and a slave apparatus remotely located from the master apparatus. The master apparatus transmits a control signal to the slave apparatus so as to remotely control the slave apparatus. The master apparatus incorporates a light-transmitting section therein which projects outwardly of the master apparatus. The light-transmitting section transmits the light signal representing a control signal generated in the master apparatus. The slave apparatus has a light-receiving section which receives the light signal. The light-transmitting section may be detachably mounted to the master apparatus. The light-transmitting section may be adapted to rotate relative to the master apparatus after the light-transmitting section has been mounted to the master apparatus. The light-transmitting section may include a plurality of light-emitting elements so that light is emitted over a wide area.

BRIEF DESCRIPTION OF THE DRAWINGS

FIG. 4 is a cross-sectional view of the second embodiment when the light-transmitting section projects from the housing.

DETAILED DESCRIPTION OF THE PREFERRED EMBODIMENTS

First embodiment

Figure 1:
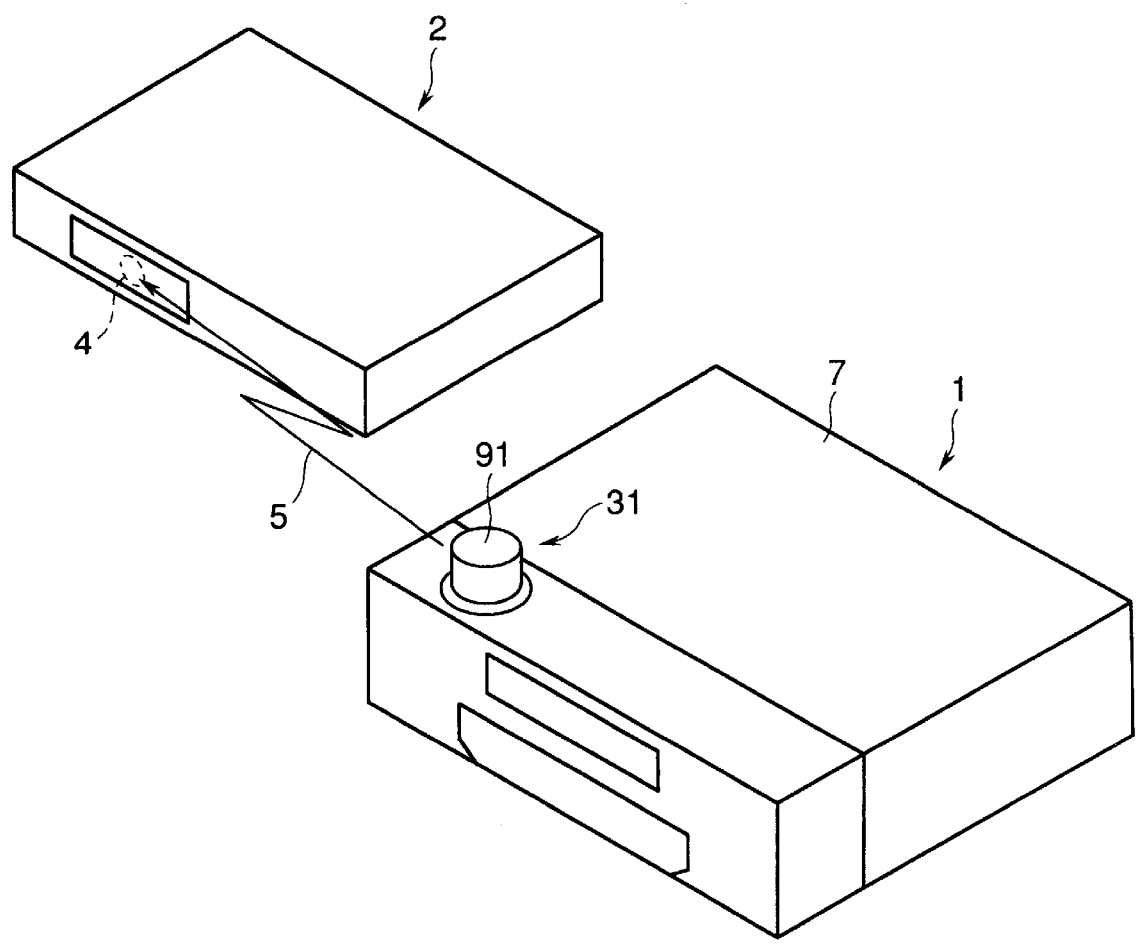
FIG. 1 is a perspective view of a magnetic recording/reproducing apparatus and tuner to which a remote control apparatus according to a first embodiment is applied.

FIG. 1 is a perspective view of the first embodiment of a remote control apparatus according to the invention, showing a light transmitting section 31 projecting from a magnetic recording/reproducing apparatus 1. The remote control apparatus includes a light-transmitting section 31 incorporated in the magnetic recording/reproducing apparatus 1 and a light-receiving section 4 incorporated in the tuner 2. The magnetic recording/reproducing apparatus 1 generates a control signal for controlling the tuner 2, and the light-transmitting section 31 converts the control signal into a light signal 5. The light-receiving section 4 receives the light signal 5 and converts the light signal into an electric signal which is then directed as a control signal to various sections in the tuner 2. In this manner, the tuner 2 is remotely controlled by the magnetic recording/reproducing apparatus 1.

Figure 2:
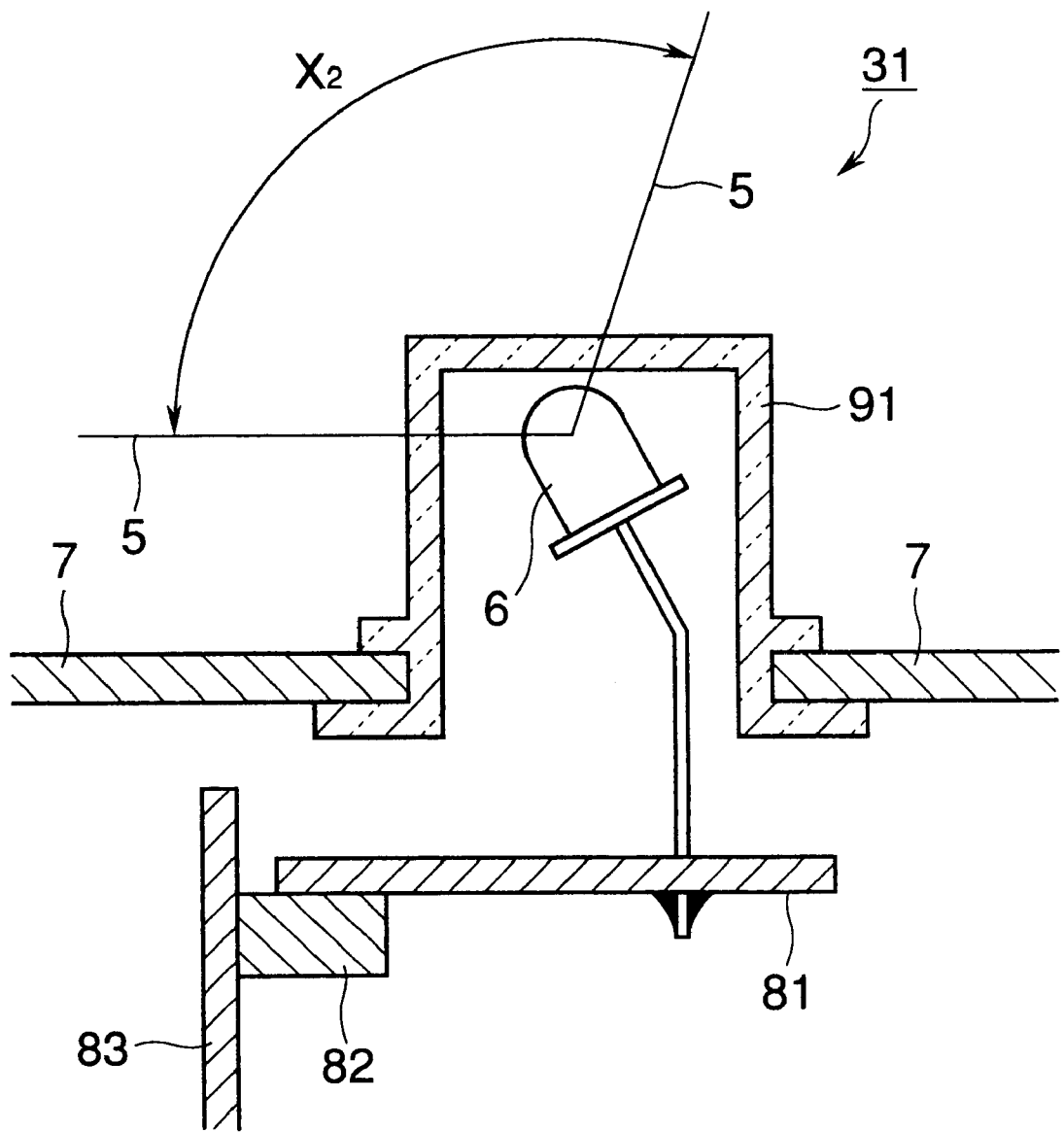
FIG. 2 is a cross-sectional view of a light-transmitting section according to the first embodiment.

FIG. 2 is a cross-sectional view showing a light-transmitting section 31. The light-transmitting section 31 includes an LED 6, and differs from the prior art shown in FIG. 12 in that the LED 6 projects from a housing 7 of the magnetic recording/reproducing apparatus 1. A printed circuit board 81 has an electrical connector 82 mounted thereto, and the circuit board 81 is mounted to a printed circuit board 83 by means of the connector 82. The printed circuit board 83 is vertically held in the housing 7. Mechanically mounting the printed circuit board 81 to the printed circuit board 83 via the connector 82 makes electrical connection of the printed circuit board 81 to the printed circuit board 83. The control signal generating circuit, not shown, generates the control signal in accordance with which the LED 6 is controlled to turn on and off to produce the light signal 5. Male and female connectors may be mounted to the printed circuit boards 81 and 82, respectively, and the two printed circuit boards 81 and 83 are connected together by inserting the male connector into the female connector. This allows easy connection between the two boards 81 and 82.

A light-transmissive plastic cap 91 is mounted on the housing and encloses the LED 6 projecting from the housing 7.

The rest of the construction is much the same as the prior art apparatus and like structural elements have been given like reference numerals but the description thereof has been omitted.

Figure 12:
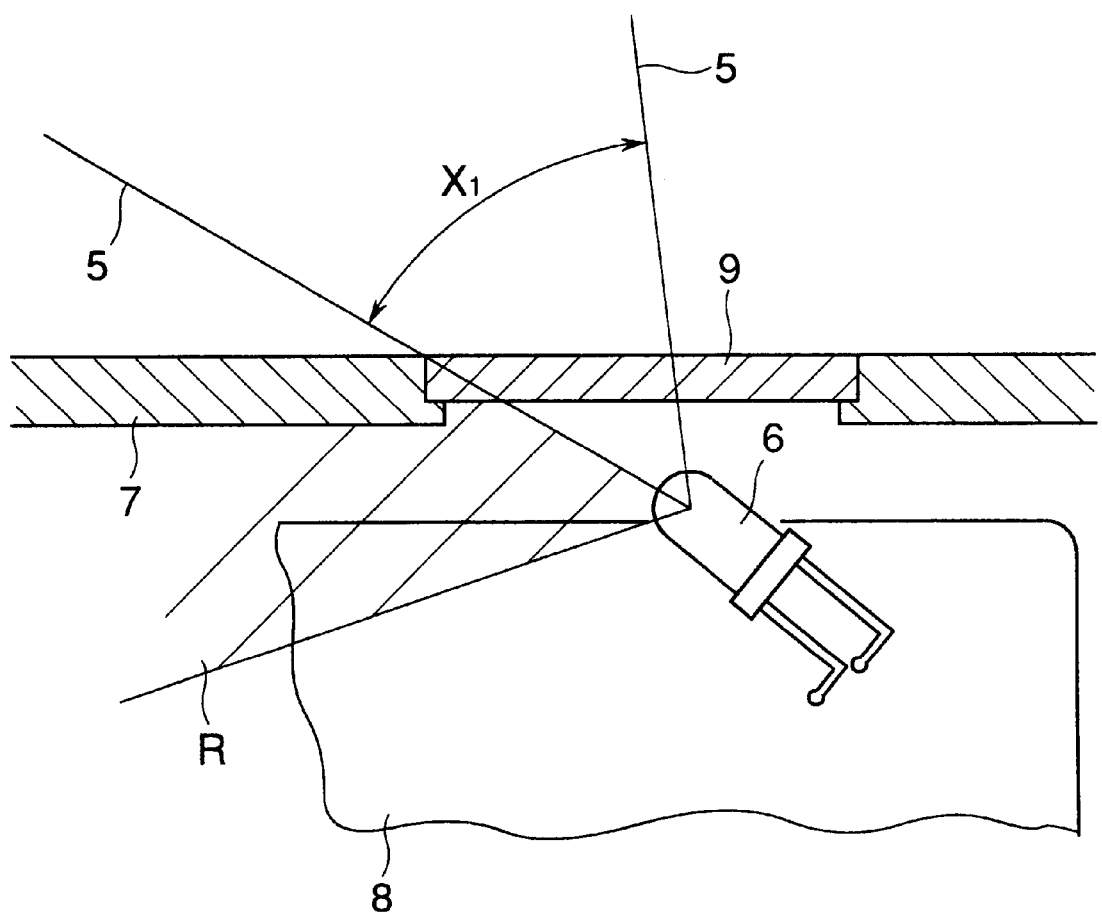
FIG. 12 is a cross-sectional view of the light-transmitting section of the prior art remote control apparatus shown in FIG. 11.

With the aforementioned construction, the light signal 5 transmitted from the light-transmitting section 31 is not blocked by the housing 7 at all, propagating over an area bounded by angle X2 larger than an area bounded by angle X1 in FIG. 12. The remote control apparatus according to the first embodiment ensures that the tuner 2 receives the light signal representing the control signal from the magnetic recording/reproducing apparatus 1.

A problem encountered by the first embodiment is that the light-transmitting section 31 projecting from the housing 7 of the magnetic recording/reproducing apparatus 1 makes packing operation of the apparatus 1 difficult. Moreover, there is a possibility of the projecting cap 91 and the LED 6 being damaged when packing. This drawback may be eliminated by second and third embodiments.

Second embodiment

Figure 3:
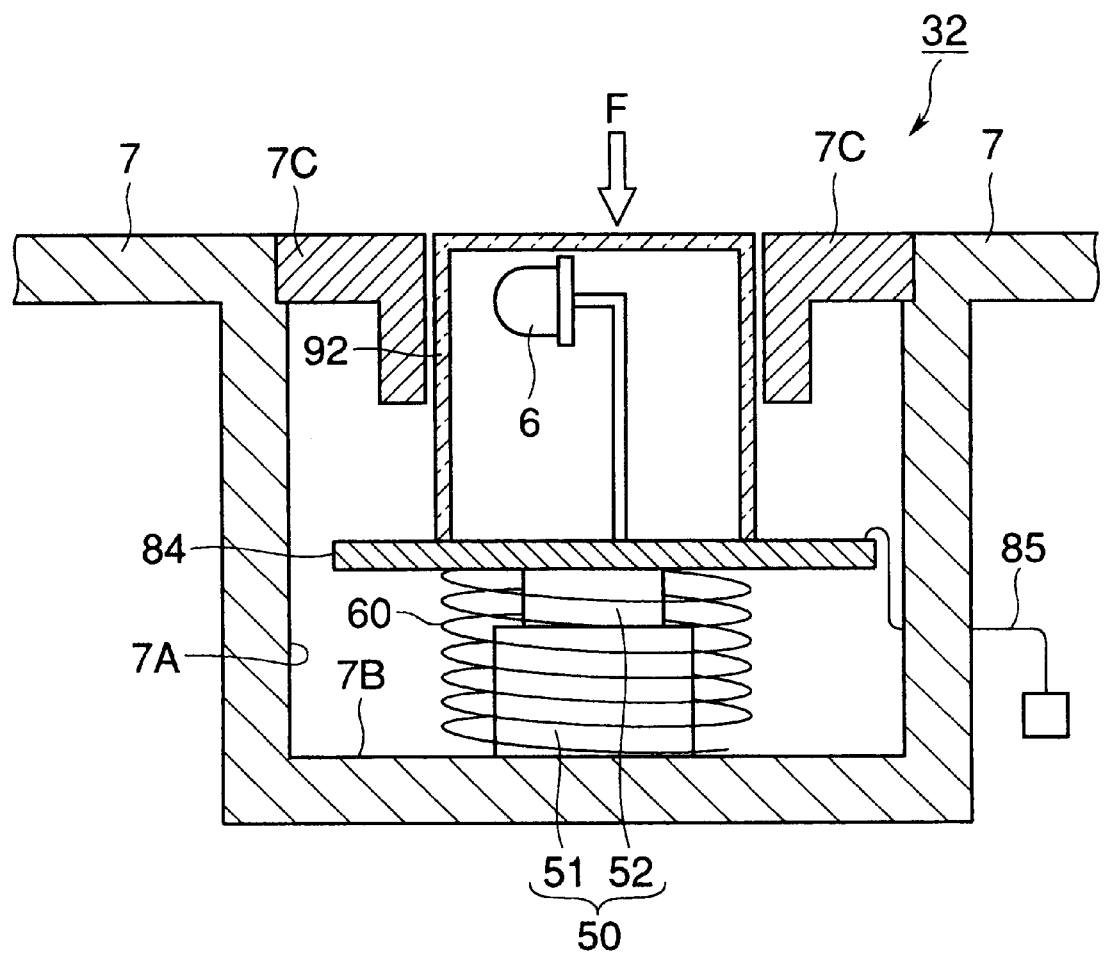
FIG. 3 is a cross-sectional view of a light-transmitting section according to a second embodiment.

FIG. 3 is a cross-sectional view of a remote control apparatus according to the second embodiment. The second embodiment greatly differs from the first embodiment in that a light-transmitting section 32 and a plastics cap 92 are retractable.

An LED 6 which forms part of the light-transmitting section 32 is fixedly mounted to the front side of a printed circuit board 84. The plastic cap 92 is also mounted on the front side of the printed circuit board 84 so as to enclose the LED 6. Leads 85 are led out of the light-transmitting section 32 into the housing 7 and are electrically connected to a control signal generating circuit, not shown, so that the control signal is sent over the leads 85 and via the printed circuit board 84 to the LED 6.

A push-lock switch 50 is provided on the back side of the printed circuit board 84. The push-lock switch 50 includes a switch body 51 fixed to the bottom 7B of a recess 7A in the housing 7 and a rod 52 vertically movably extending into the switch body 51. The rod 52 is connected at its top end to the printed circuit board 84. The printed circuit board 84 is urged vertically upward by a compression spring 60. The rod 52 moves upwardly to cause the LED 6 to project outwardly of the housing 7 as shown in FIG. 4 when the cap 92 is released after being pushed downwardly as indicated by arrow F in the state shown in FIG. 3. The rod 52 is held at the pushed-down position substantially flush with the housing 7 as shown in FIG. 3 when the cap 92 is pushed downwardly as indicated by arrow F in the state shown in FIG. 4. Thus, the state of the rod 52 is alternated between the projecting position and retracted position each time the cap 92 is pushed down and released. A decorative panel 7C fits to the recess 7A to be in flush with the housing 7 and has a hole formed in the middle thereof through which the cap 92 is retractable.

As mentioned above, the light-transmitting section 32 is retractable with respect to the housing 7, so that the LED 6 projects outwardly of the housing 7 during transmission of the light signal 5 as shown in FIG. 4, preventing the light signal 5 from being blocked by the housing 7. The projecting LED 6 allows transmission of the light signal 5 over a wide area. When remote control is not to be performed, the light-transmitting section 32 is retracted into the housing 7 as shown in FIG. 3. Therefore, the construction of the second embodiment solves the problem that the light-transmitting section projecting from the housing 7 makes packing operation of the apparatus 1 difficult.

While the push-lock switch 50 is used to cause the light-transmitting section 32 to project from and retract into the housing 7, the push-lock switch may of course be replaced by any other mechanism which performs the same function.

In the second embodiment, the compression spring 60 is mounted about the push-lock switch 50 and between the bottom 7B of the housing 7 and the printed circuit board 84 so as to urge the light-transmitting section 32 upwardly. Although the spring 60 allows reliable projection and retraction operations of the light-transmitting section 32, the spring 60 is not an essential element for causing the light-transmitting section 32 to project from and retract into the housing 7. However, it is preferred to use some bias means together with the projection-retraction mechanism by which the light-transmitting section 32 is moved vertically.

Third embodiment

Figure 5A:
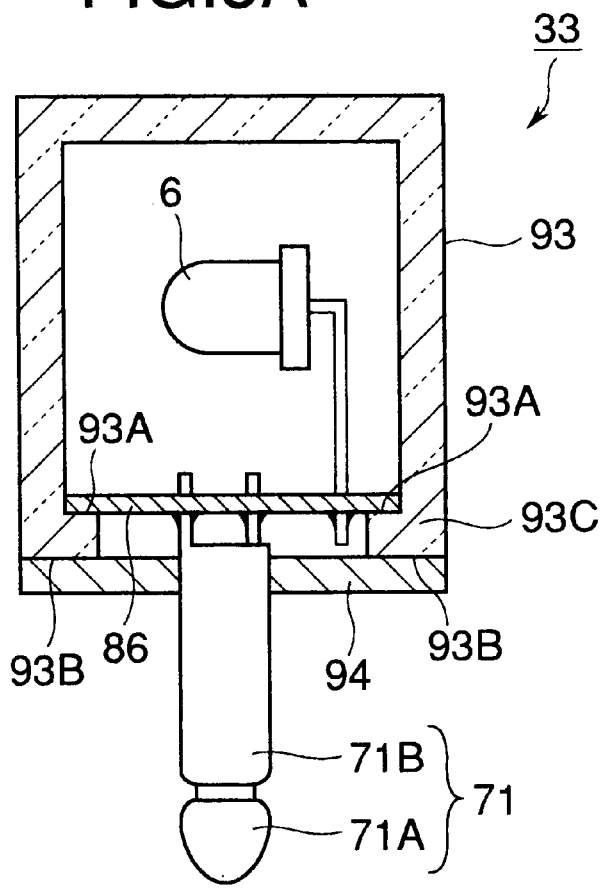
FIGS. 5A and 5B are cross-sectional views showing a light-transmitting section according to a third embodiment.
Figure 5B:
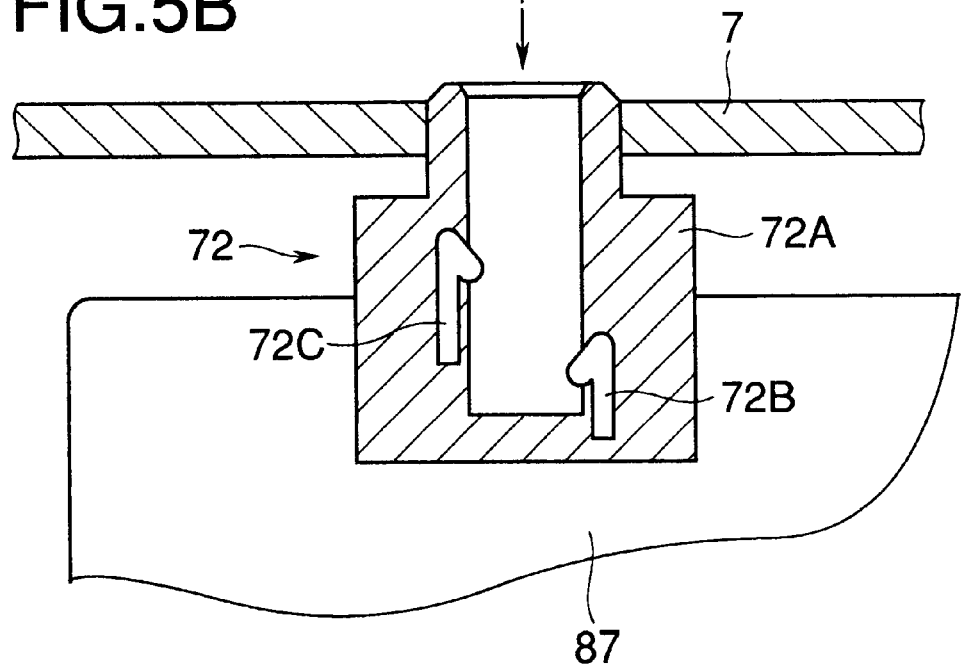

FIGS. 5A and 5B are cross-sectional views showing a light-transmitting section 33 according to the third embodiment. The third embodiment greatly differs from the first embodiment in that a light-transmitting section 33 is detachably mounted to a housing 7 of the magnetic recording/reproducing apparatus 1.

In the third embodiment, an LED 6 which forms part of the light-transmitting section 33 is fixedly mounted to the one side of a printed circuit board 86, and a cylindrical plug 71 is secured to the other side. A plastic cap 93 houses the printed circuit board 86 and the LED 6 therein holding the printed circuit board 86 on an inner or upper surface 93A of an inwardly projecting end portion 93C, and is closed by a plate 94 placed to an outer or lower surface 93B of the end portion 93C. The plate 94 has a hole through which the plug 71 extends downwardly outwardly of the light-transmitting section 33. The light-transmitting section 33 is firmly mounted to the housing 7 by plugging the plug 71 into a later described jack 72, and the section 33 is disconnected from the housing 7 by pulling the plug 71 out of the housing 7.

The jack 72 includes a body 72A fixedly mounted to the printed circuit board 87 in the housing 7, and terminals 72B and 72C. When the plug 71 is plugged into the body 72A, the tip end portion 71A and cylindrical portion 71B of the plug 71 move into contact engagement with the terminals 72B and 72C, respectively. These terminals 72B and 72C are electrically connected to the control signal generating circuit, not shown. Upon plugging the plug 71 into the jack 72, the control signal is supplied from the control signal generating circuit to the LED 6 via the plug 71 and printed circuit board 86, so that the LED 6 emits a light signal 5.

After the plug 71 has been pulled out of the jack 72, the housing 7 is substantially flat.

As mentioned above, the third embodiment is of construction where the light-transmitting section 33 is detachably mounted to the housing 7. The light-transmitting section 33 is mounted such that the section 33 projects from the housing 7. Therefore, the light signal 5 is not blocked by the housing 7, reaching over a wide area. The construction eliminates the problem that the light-transmitting section 33 projects from the housing 7 and may be damaged when packing up the magnetic recording/reproducing apparatus 1.

Figure 6:
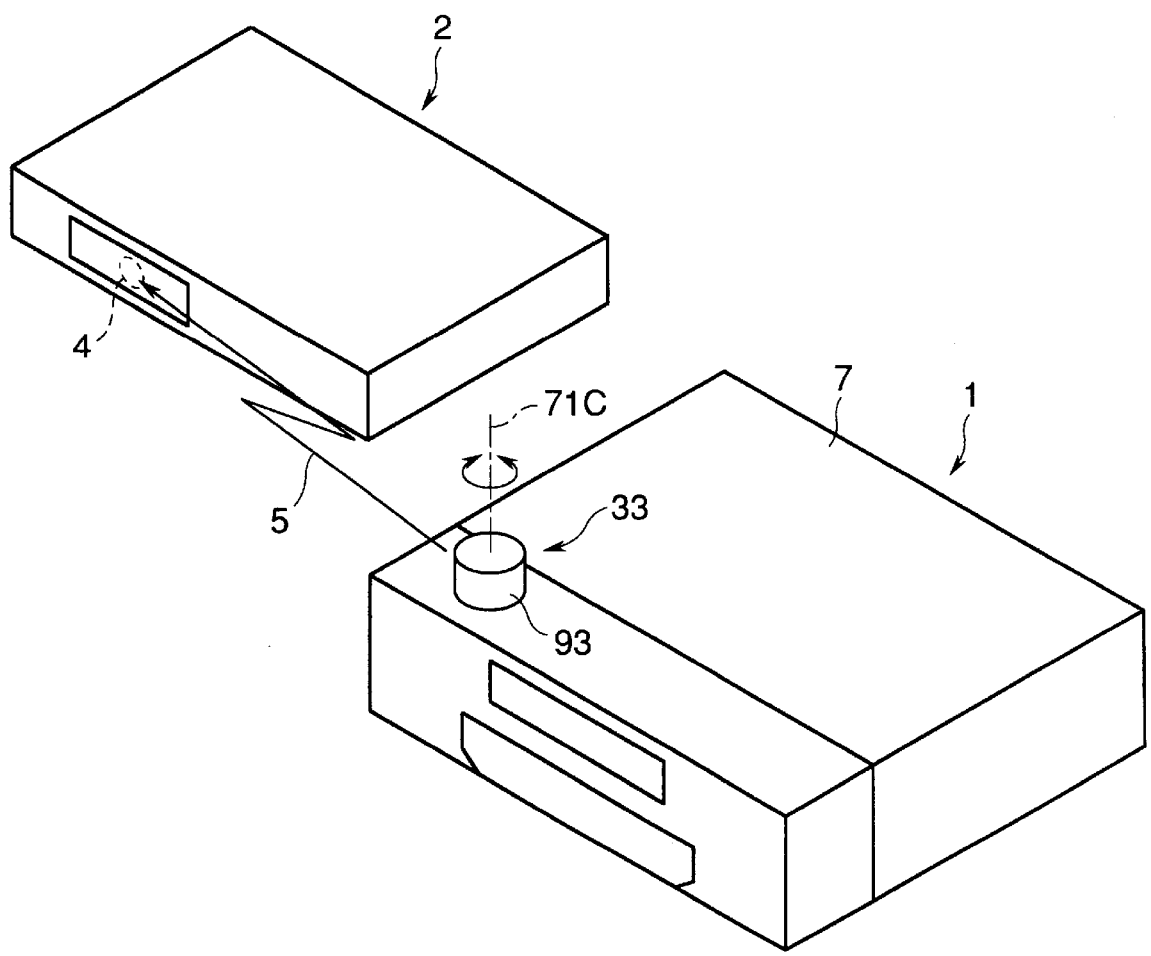
FIG. 6 is a perspective view of a magnetic recording/reproducing apparatus and tuner to which a remote control apparatus according to the third embodiment is applied.

The plug-to-jack construction is advantageous in that the light-transmitting section 33 can be rotated through 360 degrees about a longitudinal axis 71C of the plug 71 with the plug 71 plugged in the jack 72 as shown in FIGS. 5 and 6. This is particularly useful when the tuner 2 is moved from one location to another. The light-transmitting section 33 only needs to be rotated to the direction in which the tuner 2 can receive the light signal 5 with a sufficiently strong signal level.

While a plug-jack construction is used for detachably mounting the light-transmitting section 33, other construction may also be employed in order to detachably mount the light-transmitting section 33 to the housing 7.

Fourth embodiment

Figure 7:
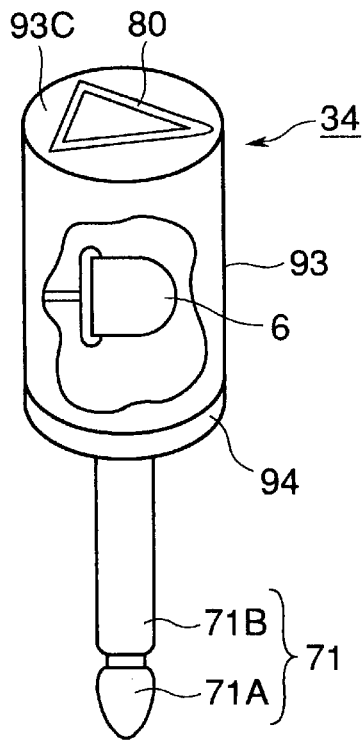
FIG. 7 is a partially cut-away perspective view of a light-transmitting section according to a fourth embodiment.

FIG. 7 is a partially cut-away perspective view of a light-transmitting section according to the fourth embodiment. The fourth embodiment is characterized in that the light-transmitting section 34 is provided with a display indicative of directions in which a light signal 5 is transmitted. The rest of the construction is the same as the third embodiment and the description thereof is omitted.

In the fourth embodiment, a direction-indicating mark 80 is engraved in or printed on the top surface 93c of the cap 93 so as to indicate the direction in which the LED 6 emits the light signal 5 with highest intensity. The direction-indicating mark 80 is, for example, an arrow-shaped isosceles triangle. Thus, the direction-indicating mark 80 allows the user to properly orient the light-transmitting section 34 toward the tuner 2. This ensures that the light signal 5 transmitted from the light-transmitting section 34 reaches the light-receiving section 4.

Fifth embodiment

Figure 8:
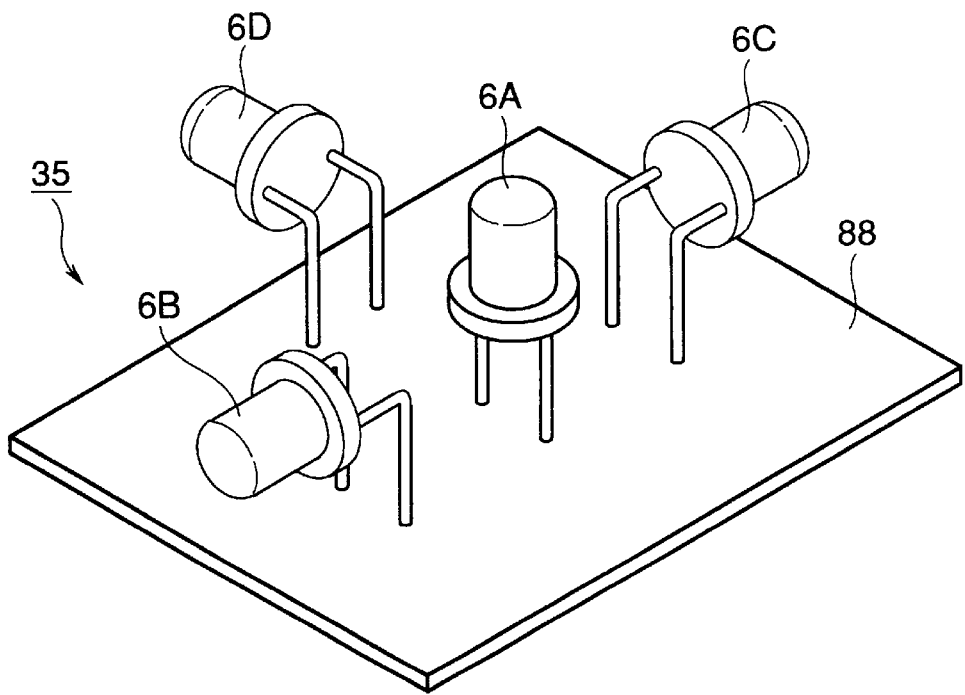
FIG. 8 is a perspective view of a pertinent part of a light-transmitting section according to a fifth embodiment.

FIG. 8 is a perspective view of a pertinent part of a light-transmitting section according to the fifth embodiment.

Figure 9:
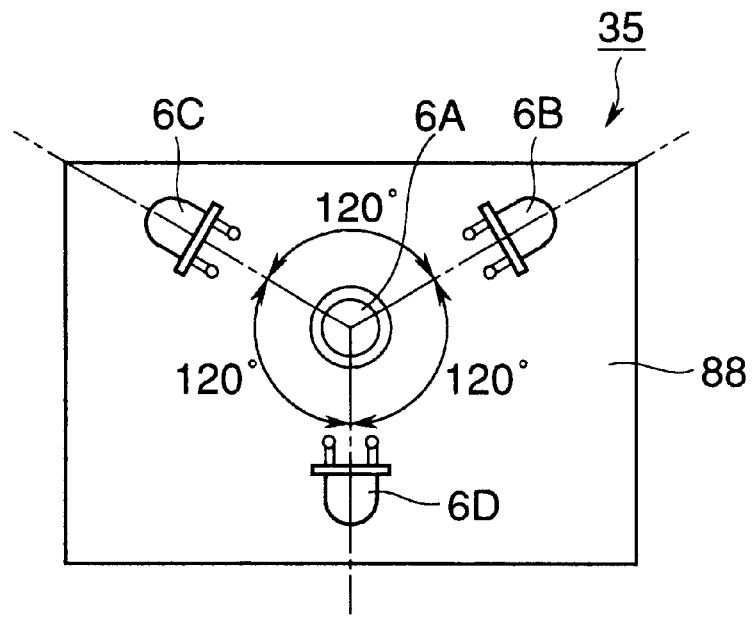
FIG. 9 is a top view of the essential part shown in FIG. 8.

FIG. 9 is a top view of FIG. 8. A light-transmitting section 35 includes a printed circuit board 88 and a plurality of LEDs 6A–6D mounted on the printed circuit board 88. The LED 6A is mounted in the middle of the printed circuit board 88 and emits light with an optical axis thereof normal to the surface of the printed circuit board 88. The LEDs 6B–6D are disposed about the LED 6A 120 degrees apart and each LED emits light with an optical axis thereof extending in a radial direction and in parallel with the printed circuit board 88.

The light-transmitting section 35 having a plurality of LEDs 6A–6D emits light over a wider area. Since commonly used LEDs emit light over an area within 60–70 degrees of the optical axis, the aforementioned arrangement of the LEDs 6A–6D makes it possible to emit light at least over an upper hemispheric area of the circuit board 88. The light-receiving section 4 of the tuner 2 located anywhere within the aforementioned area can receive the light with substantially the same intensity.

Figure 10:
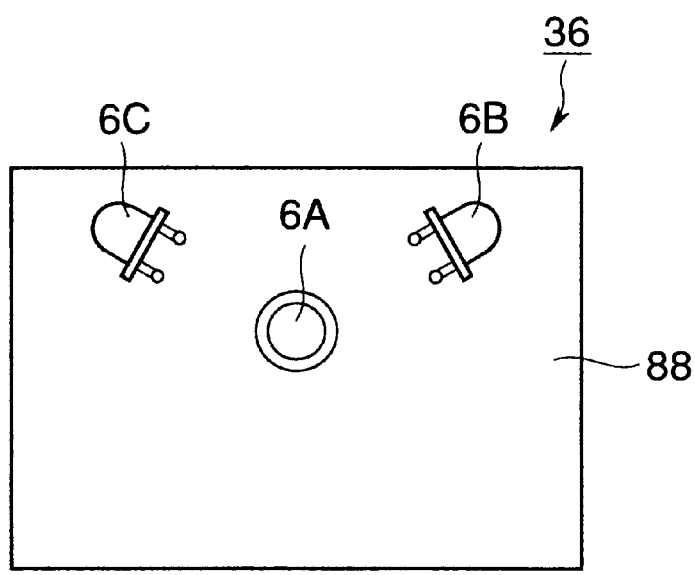
FIG. 10 shows a modified arrangement of LEDs of the fifth embodiment.
Figure 11:
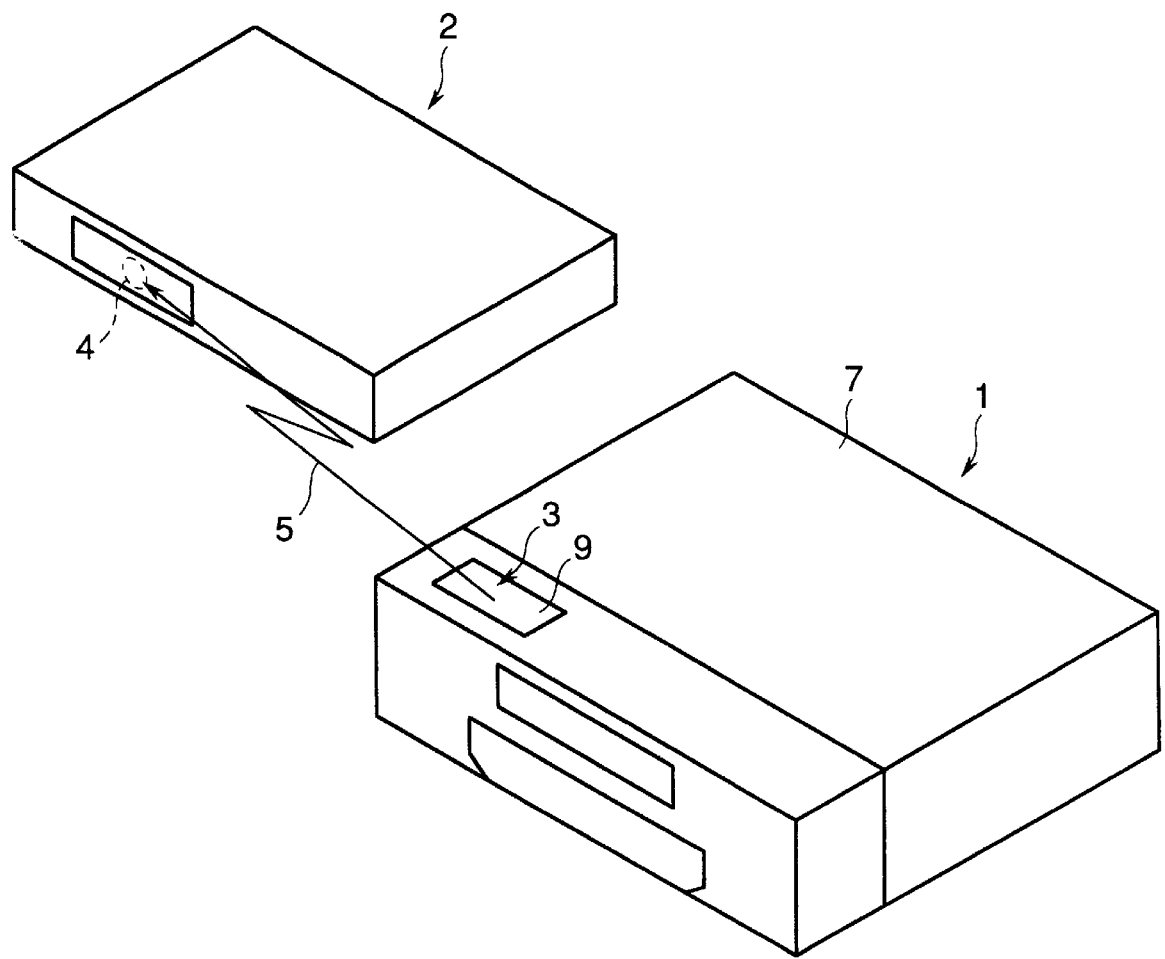
FIG. 11 is a perspective view of a magnetic recording/reproducing apparatus and tuner to which a prior art remote control apparatus is applied.

The number of the LEDs and their arrangement in the embodiment are only exemplary and, for example, arranging three LEDs 6A–6C as shown in FIG. 10 allows emitting of light over an area more than a half of that when four LEDs are used. The arrangement of the light-transmitting sections 35 and 36 may also be used in place of the LEDs in the light-transmitting sections 31 to 34 of the first to fourth embodiments.

Although the first to fifth embodiments have been described with reference to the light-transmitting section provided in the magnetic recording/reproducing apparatus 1 as a master apparatus and the light-receiving section 4 provided in the tuner 2 as a slave apparatus separate from the magnetic recording/reproducing apparatus 1, the master and slave apparatuses may be any apparatuses combined in any forms as far as the control signal is transmitted from the master apparatus to the slave apparatus.

While the caps 91, 92, and 93 are formed of a light transmissive plastic material, they may be made of other light transmissive materials such as glass. A light-transmissive material need not be used for the entire bodies of the caps 91, 92, and 93 but for only areas through which light is transmitted. The transmittance of the caps 91, 92, and 93 is preferably about 100% but not necessarily.

While the invention has been described with reference to the light-transmitting section projecting from the top surface of the magnetic recording/reproducing apparatus 1, the light-transmitting section may be located at any part of the magnetic recording/reproducing apparatus 1, such as side surfaces and bottom surface.

What is claimed is:

1. A remote control apparatus, comprising:

a housing;

a light-transmitting section for transmitting a light signal to an outside of said housing;

a retracting unit for selectively moving said light transmitting section between a first position where said light transmitting section is retracted within said housing and a second position where said light transmitting section is projected outside of said housing;

biasing means for urging said light-transmitting section towards said second position; and a lock mechanism for maintaining said light-transmitting section in said first position.

2. The remote control apparatus according to claim 19, wherein said light-transmitting section includes a plurality of light-emitting elements.

3. The remote control apparatus according to claim 2, wherein said light-transmitting section includes, at least one first light-emitting element for emitting light with an optical axis thereof oriented in a first direction, and a plurality of second light-emitting elements disposed around said first light-emitting element, each of said second light-emitting elements emitting light with an optical axis thereof radially extending in a second direction substantially perpendicular to said first direction.

4. The remote control apparatus according to claim 1, wherein said light-transmitting section includes a plurality of light-emitting elements.

5. The remote control apparatus according to claim 4, wherein said light-transmitting section includes;

at least one first light-emitting element for emitting light with an optical axis thereof oriented in a first direction; and a plurality of second light-emitting elements disposed around said first light-emitting element, each of said second light-emitting elements emitting light with an optical axis thereof radially extending in a second direction substantially perpendicular to said first direction.

6. A remote control apparatus, comprising:

a housing having a jack; and a light-transmitting section for transmitting a light signal and having only a single cylindrical plug protruding therefrom, said light-transmitting section being rotatably mounted on said housing about a longitudinal axis of said cylindrical plug when said plug is inserted into said jack.

7. The remote control apparatus according to claim 6, wherein said light-transmitting section is provided with an indicator for indicating a direction in which the light signal is transmitted.

8. The remote control apparatus according to claim 7, wherein said light-transmitting section includes a plurality of light-emitting elements.

9. The remote control apparatus according to claim 8, wherein said light-transmitting section includes, at least one first light-emitting element for emitting light with an optical axis thereof oriented in a first direction, and a plurality of second light-emitting elements disposed around said first light-emitting element, each of said second light-emitting elements emitting light with an optical axis thereof radially extending in a second direction substantially perpendicular to said first direction.

10. The remote control apparatus according to claim 6, wherein said light-transmitting section includes a plurality of light-emitting elements.

11. The remote control apparatus according to claim 10, wherein said light-transmitting section includes, at least one first light-emitting element for emitting light with an optical axis thereof oriented in a first direction, and a plurality of second light-emitting elements disposed around said first light-emitting element, each of said second light-emitting elements emitting light with an optical axis thereof radially extending in a second direction substantially perpendicular to said first direction.

12. A remote control apparatus, comprising:

a housing;

a light-transmitting section for transmitting a light signal within a predetermined directional range, said light-transmitting section being rotatably mounted on said housing such that the light signal is transmitted toward a desired direction without moving said housing;

a light-transmitting cover which covers said light transmitting section; and a direction indicator, provided on said light-transmitting cover, for indicating a direction in which said light transmitting section transmits the light signal.

13. The remote control apparatus of claim 12, wherein said light-transmitting section is provided with an indicator for indicating a direction in which the light signal is transmitted.

14. The remote control apparatus according to claim 13, wherein said light-transmitting section includes a plurality of light-emitting elements.

15. The remote control apparatus according to claim 14, wherein said light-transmitting section includes, at least one first light-emitting element for emitting light with an optical axis thereof oriented in a first direction, and a plurality of second light-emitting elements disposed around said first light-emitting element, each of said second light-emitting elements emitting light with an optical axis thereof radially extending in a second direction substantially perpendicular to said first direction.

16. The remote control apparatus according to claim 12, wherein said light-transmitting section includes a plurality of light-emitting elements.

17. The remote control apparatus according to claim 16, wherein said light-transmitting section includes, at least one first light-emitting element for emitting light with an optical axis thereof oriented in a first direction, and a plurality of second light-emitting elements disposed around said first light-emitting element, each of said second light-emitting elements emitting light with an optical axis thereof radially extending in a second direction substantially perpendicular to said first direction.

18. A remote control apparatus, comprising:

a housing having an opening;

a circuit board disposed within said housing;

a light transmitter for transmitting a light signal to an outside of said housing, said light transmitter having an attaching portion directly attached to said circuit board and a light emitting portion protruding from said opening; and a light transmissive cap fixed to said housing for covering said opening and said light emitting portion of said light transmitter.

* * * * *